United States Patent
Tu et al.

(10) Patent No.: US 9,905,548 B2
(45) Date of Patent: Feb. 27, 2018

(54) OPTICAL MODULE INTEGRATED PACKAGE

(71) Applicant: LINGSEN PRECISION INDUSTRIES, LTD., Taichung (TW)

(72) Inventors: Ming-Te Tu, Taichung (TW); Yao-Ting Yeh, Taichung (TW); Yu-Chen Lin, Taichung (TW)

(73) Assignee: LINGSEN PRECISION INDUSTRIES, LTD., Taichung (TW)

( * ) Notice: Subject to any disclaimer, the term of this patent is extended or adjusted under 35 U.S.C. 154(b) by 0 days.

(21) Appl. No.: 15/247,300

(22) Filed: Aug. 25, 2016

(65) Prior Publication Data

US 2016/0365339 A1 Dec. 15, 2016

Related U.S. Application Data

(62) Division of application No. 14/337,721, filed on Jul. 22, 2014, now Pat. No. 9,449,955.

(30) Foreign Application Priority Data

Mar. 31, 2014 (TW) .............................. 103112030 A

(51) Int. Cl.
*H01L 25/16* (2006.01)
*H01L 31/173* (2006.01)
*H01L 31/0203* (2014.01)
*H01L 31/0232* (2014.01)

(Continued)

(52) U.S. Cl.
CPC ........ *H01L 25/167* (2013.01); *H01L 31/0203* (2013.01); *H01L 31/0232* (2013.01); *H01L 31/02325* (2013.01); *H01L 31/167* (2013.01); *H01L 31/173* (2013.01); *H01L 24/73* (2013.01); *H01L 2224/32225* (2013.01); *H01L 2224/48091* (2013.01); *H01L 2224/48137* (2013.01); *H01L 2224/48227* (2013.01); *H01L 2224/73265* (2013.01); *H01L 2924/1433* (2013.01); *Y02P 40/57* (2015.11)

(58) Field of Classification Search
CPC . H01L 25/167; H01L 31/173; H01L 31/0203; H01L 31/02325
See application file for complete search history.

(56) References Cited

U.S. PATENT DOCUMENTS

| 7,037,002 | B2 * | 5/2006 | Takehata | G02B 6/4201 |
| | | | | 385/93 |
| 7,232,263 | B2 * | 6/2007 | Sashinaka | G02B 6/4204 |
| | | | | 385/52 |

(Continued)

*Primary Examiner* — Dung Le
(74) *Attorney, Agent, or Firm* — Muncy, Geissler, Olds & Lowe, P.C.

(57) ABSTRACT

A an optical module integrated package includes a substrate, a light-receiving chip mounted in a light-receiving region of the substrate, an electronic component mounted in the substrate, a cover mounted on the substrate and having a light-receiving chip disposed above the light-receiving hole, and a lens fixedly mounted in the light-receiving hole of the cover. Thus, the optical module integrated package not only have the chip and the electronic component integrated therein to reduce the packaging cost and to improve the yield but also provide a light filtering, focusing or diffusing effect to enhance optical recognition accuracy.

8 Claims, 2 Drawing Sheets

(51) Int. Cl.
*H01L 31/167* (2006.01)
*H01L 23/00* (2006.01)

(56) References Cited

U.S. PATENT DOCUMENTS

| | | | |
|---|---|---|---|
| 8,766,195 B2 * | 7/2014 | Tang | G01S 7/4813 250/353 |
| 2004/0175080 A1 | 9/2004 | Yamauchi | |
| 2010/0039713 A1 * | 2/2010 | Lusinchi | G02B 13/001 359/819 |
| 2010/0214432 A1 | 8/2010 | Nakata | |
| 2014/0192832 A1 * | 7/2014 | Shih | H01L 25/00 372/44.01 |
| 2014/0223734 A1 | 8/2014 | Song | |

* cited by examiner

OPTICAL MODULE INTEGRATED PACKAGE

CROSS REFERENCE TO RELATED APPLICATIONS

This application is a Divisional of application Ser. No. 14/337,721, filed on 22 Jul. 2014, which was issued as U.S. Pat. No. 9,449,955 on 20 Sep. 2016, for which priority is claimed under 35 U.S.C. § 120; and this application claims priority of Application No. 103112030 filed in Taiwan on 31 Mar. 2014 under 35 U.S.C. § 119, the entire contents of all of which are hereby incorporated by reference.

BACKGROUND OF THE INVENTION

1. Field of the Invention

The present invention relates to semiconductor packaging technology and more particularly, to an optical module integrated package, which not only reduces the packaging cost and improves the yield but also enhances optical recognition accuracy.

2. Description of the Related Art

In order to prevent the touch panel from being inadvertently touched or to save power consumption, a handheld electronic device (such as smart phone) is generally equipped with a proximity optical sensor module so that when the handheld electronic device approaches the surface of an object (for example, the face of a person), the proximity optical sensor will be induced to run a partial power-down operation. The principle of operation of this proximity optical sensor module is the use of a light-emitting chip to emit a light source toward a medium (the face of a person), and a light-receiving chip to receive reflected light from the medium and to convert received light signal into a corresponding electronic signal for follow-up processing.

According to conventional optical module packaging techniques, the light-emitting chip, the light-receiving chip and the other auxiliary passive component are separately packaged and then mounted in a common substrate. This manufacturing method of separately packaging individual components and then gathering the packaged components greatly increases the manufacturing cost. Further, conventional optical modules do not have a light focusing component. Thus, when the light beam emitted by the light-emitting chip falls upon an uneven surface of an object, the light-receiving chip will be unable to accurately receive the reflected light beam, affecting the subsequent interpretation.

In conclusion, the conventional optical modules have the aforesaid drawbacks and need to be improved.

SUMMARY OF THE INVENTION

The present invention has been accomplished under the circumstances in view. It is the main object of the present invention to provide an optical module integrated package, which not only reduces the packaging cost and improves the yield but also enhances optical recognition accuracy.

To achieve this and other objects of the present invention, an optical module integrated package in accordance with one embodiment of the present invention comprises a substrate defining a light-receiving region, a light-receiving chip mounted in the light-receiving region of the substrate, an electronic component mounted in the substrate, a cover mounted on the substrate and having a light-receiving hole disposed above and aimed at the light-receiving chip, and a lens fixedly mounted in the cover and positioned in the light-receiving hole.

Preferably, the electronic component is an application-specific integrated circuit (ASIC).

Preferably, the cover comprises an accommodation chamber in communication with the light-receiving hole, and the lens is disposed in an inner side of the accommodation chamber.

Preferably, the lens is selected from the group of planar lenses, concave lenses and convex lenses.

Preferably, the light-receiving chip or the electronic component is mounted in the substrate using surface mounting technology.

Preferably, the light-receiving chip or the electronic component is mounted in the substrate using wire bond technology.

Preferably, the lens is selectively mounted in the cover by an adhesive bonding technique or injection molding technique.

To achieve this and other objects of the present invention, an optical module integrated package in accordance with another embodiment of the present invention comprises a substrate defining a light-receiving region and a light-emitting region, a light-receiving chip mounted in the light-receiving region of the substrate, a light-emitting chip mounted in the light-emitting region of the substrate, a cover mounted on the substrate, which comprises a light-emitting hole, a light-receiving hole, a first accommodation chamber, a second accommodation chamber and a partition wall separating the first accommodation chamber and the second accommodation chamber, the light-emitting hole and the light-receiving hole being respectively disposed above the light-emitting chip and the light-receiving chip, the first accommodation chamber and the second accommodation chamber being respectively disposed in communication with the light-receiving hole and the light-emitting hole, and two lenses respective mounted in the first accommodation chamber and second accommodation chamber of the cover and respectively positioned above the light-receiving hole and the light-emitting hole.

Preferably, the two lenses are selected from the group of planar lenses, concave lenses and convex lenses.

Preferably, the lenses are fixedly mounted in the cover.

Preferably, one lens is fixedly mounted in the cover, and the other lens is injection-molded on a light-emitting surface of the light-emitting chip.

Preferably, the optical module integrated package further comprises an electronic component mounted in the substrate.

Preferably, the light-emitting chip, the light-receiving chip and the electronic component are bonded to the substrate using surface mounting technology.

Preferably, the light-emitting chip, the light-receiving chip and the electronic component are bonded to the substrate using wire bond technology.

Preferably, at least one lens is mounted in the cover by adhesive bonding or injection molding, and the lens is selectively made of glass or plastics.

Preferably, the lens comprises a filter layer coated on a surface thereof.

Preferably, the cover is a one piece member selectively made of metal or plastics.

Thus, the optical module integrated package not only have the chip and the electronic component integrated therein to reduce the packaging cost and to improve the yield but also provide a light filtering, focusing or diffusing effect to enhance optical recognition accuracy.

Other advantages and features of the present invention will be fully understood by reference to the following specification in conjunction with the accompanying drawings, in which like reference signs denote like components of structure.

DETAILED DESCRIPTION OF THE INVENTION

Figure 1:
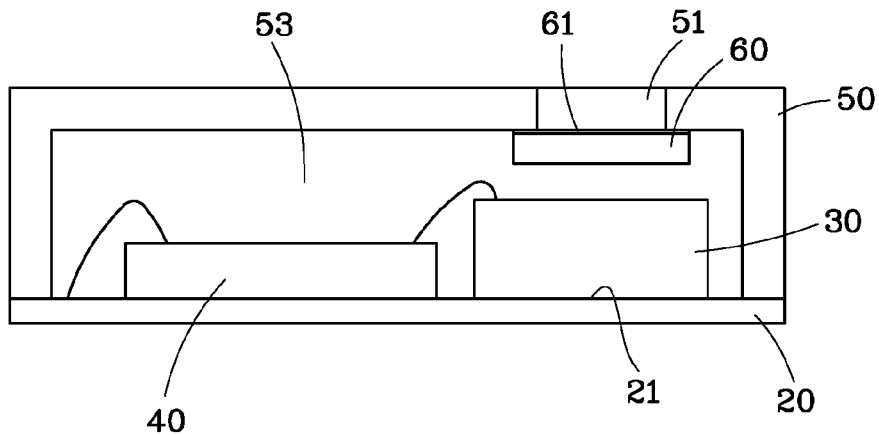
FIG. 1 is schematic sectional view of an optical module integrated package in accordance with a first embodiment of the present invention, illustrating a planar lens fixedly mounted inside a cover.
Figure 2:
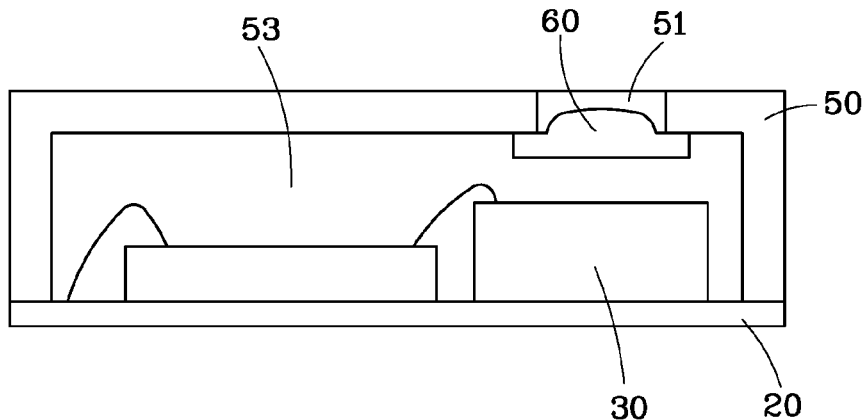
FIG. 2 is a sectional view of an alternate form of the optical module integrated package in accordance with the first embodiment of the present invention, illustrating a convex lens used.
Figure 3:
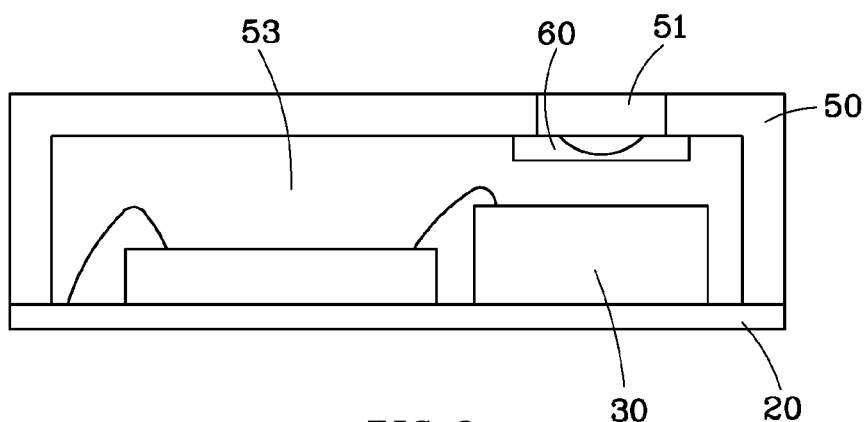
FIG. 3 is a sectional view of another alternate form of the optical module integrated package in accordance with the first embodiment of the present invention, illustrating a concave lens used.

Referring to FIGS. 1-3, an optical module integrated package 10 in accordance with a first embodiment of the present invention is shown. The optical module integrated package 10 comprises a substrate 20, a light-receiving chip 30, an electronic component 40, a cover 50 and a lens 60.

The substrate 20 defines a light-receiving region 21. Further, in order to reduce the material cost, the substrate 20 can be a non-ceramic substrate made of bismaleimide triazine (BT).

The light-receiving chip 30 is mounted in the light-receiving region 21 of the substrate 20 for receiving external light.

The electronic component 40 is installed in the substrate 20. In order to meet the demand in the function of different products, the electronic component 40 can be an application-specific integrated circuit (ASIC) or any other component having power-saving features.

The cover 50 is a one piece member made of metal or plastics and mounted on the substrate 20, comprising a light-receiving hole 51 and an accommodation chamber 53. The light-receiving hole 51 is disposed above and aimed at the light-receiving chip 30. The accommodation chamber 53 is kept in communication with the light-receiving hole 51 for enabling outside light to pass through the light-receiving hole 51 to the light-receiving chip 30 and to be received by the light-receiving chip 30.

The lens 60 is fixedly mounted in the cover 50 and positioned in the light-receiving hole 51. In this first embodiment, the lens 60 can be a planar lens, concave lens or convex lens. Further, the lens 60 can be configured to provide any of a variety of curvatures to fit different requirements from different clients, improving the efficiency of the transfer of external light source to the light-receiving chip 30. Alternatively, the lens 60 can be coated with a filter layer 61 on the surface thereof for wavelength filtering. With respect to the mounting of the lens 60, the lens 60 can be bonded to an inner side in the accommodation chamber 53 of the cover 50 with an adhesive. Alternatively, the lens 60 can be embedded in the cover 50 using an injection molding technique. Because the chip and the lens 60 are separately made and because the lens 60 is not directly formed on the chip by compression molding, the fabrication of the lens 60 does not affect the overall yield of the package. This will help reduce the development cost, and can enhance the yield of the product.

Further, in the first embodiment of the present invention, the electrical connection of the package is: fixedly mounting the light-receiving chip 30 and the electronic component 40 in the substrate 20, and then employing a wire bonding technique to electrically connect the light-receiving chip 30 and the electronic component 40 and the substrate 20.

Figure 4:
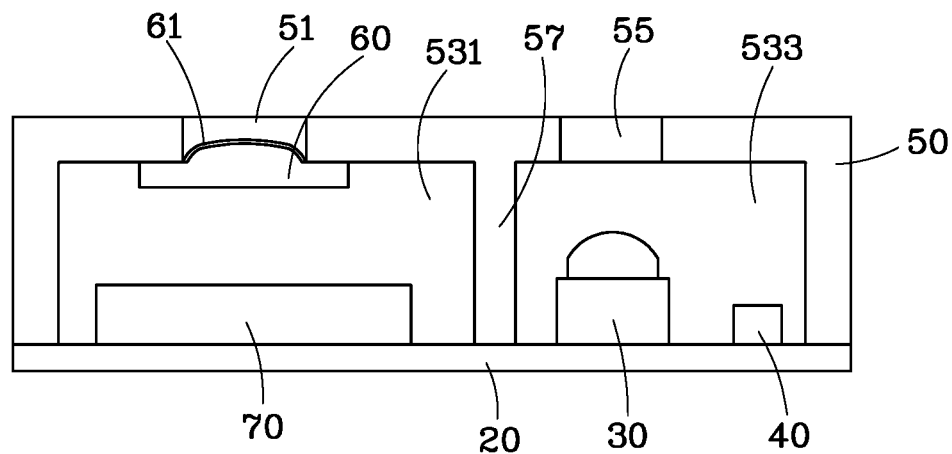
FIG. 4 is a sectional view of an optical module integrated package in accordance with a second embodiment of the present invention, illustrating one lens mounted in a first accommodation chamber above a light-receiving chip and a second lens disposed above a light-emitting chip.
Figure 5:
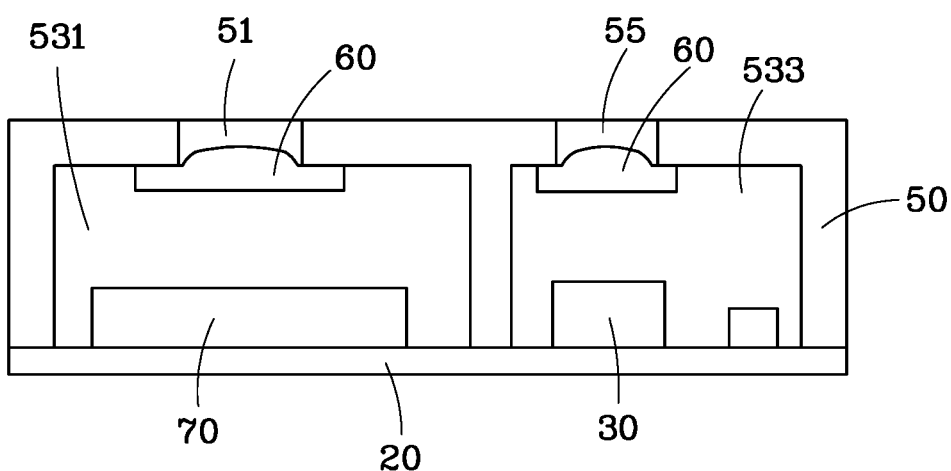
FIG. 5 is a sectional view of an alternate form of the optical module integrated package in accordance with a second embodiment of the present invention, illustrating two lenses respectively mounted in a first accommodation chamber and a second accommodation chamber and respectively disposed above a light-receiving chip and a light-emitting chip.

Referring to FIGS. 4 and 5, an optical module integrated package 10' in accordance with a second embodiment of the present invention is shown. As illustrated, the optical module integrated package 10' comprises a substrate 20, a light-receiving chip 30, a light-emitting hip 70, an electronic component 40, a cover 50 and at least one lens 60. This second embodiment is substantially similar to the aforesaid first embodiment with the exception that the substrate 20 defines a light-receiving region 21 and a light-emitting region 23; the light-emitting chip 70 is mounted in the light-emitting region 23; the cover 50 comprises a light-emitting hole 55 disposed above the light-emitting chip 70 for enabling the emitted light from the light-emitting chip 70 to go to the outside in one direction without causing interference with the light-receiving operation of the light-receiving chip 30; a partition wall 57 is provided to divide the inside space of the cover 50 into a first accommodation chamber 531 in communication with the light-receiving hole 51 and a second accommodation chamber 533 in communication with the light-emitting hole 55; the light-receiving chip 30 is disposed in the first accommodation chamber 531; the light-emitting chip 70 and the electronic component 40 are disposed in the second accommodation chamber 533. Thus, the light emitted by the light-emitting chip 70 goes through the light-emitting hole 55 to the surface of an external object and is then reflected by the external object onto the light-receiving hole 51 and received by the light-receiving chip 30. The lateral light of the light-emitting chip 70 will be blocked by the partition wall 57 and prohibited from falling upon the light-receiving chip 30 to cause interference.

With respect to electrical connection between the light-receiving chip 30, light-emitting chip 70 and electronic component 40 and the substrate 20, the aforesaid wire bond technology can be employed. Alternatively, surface mounting technology can also be employed to install the light-receiving chip 30, the light-emitting chip 70 and the electronic component 40 in the substrate 20.

With respect to the design of the lenses 60, as shown in FIG. 4, one lens 60 is mounted in the light-receiving hole 51 of the cover 50 at an inner side of the first accommodation chamber 531 and right above the light-receiving chip 30; the other lens 60 is mounted on the top surface of the light-emitting chip 70. Alternatively, as shown in FIG. 5, the two lenses 60 are respectively mounted in the light-receiving hole 51 and the light-emitting hole 55 at respective inner sides of the first and second accommodation chambers 531;533, and respectively disposed above the light-receiving chip 30 and the light-emitting chip 70. Thus, the lenses 60 are locate at different locations and can be selected from the group of concave lenses, convex lenses and planar lenses. Either in light emitting or receiving operation, the performance of the optical module integrated packages 10;10' can easily be adjusted to meet different application requirements. Further, because the lens 60 provides a light filtering, focusing or diffusing effect, it enhances optical recognition accuracy.

In conclusion, the optical module integrated package of the invention has the light-emitting chip, the light-receiving chip and the electronic component integrated in the package to reduce the packaging cost and to improve the yield of the product. Further, the lens provides a light filtering, focusing or diffusing effect to enhance optical recognition accuracy.

Although particular embodiments of the invention have been described in detail for purposes of illustration, various modifications and enhancements may be made without departing from the spirit and scope of the invention. Accordingly, the invention is not to be limited except as by the appended claims.

What is claimed is:

1. An optical module integrated package, comprising:
   a substrate defining a light-receiving region;
   a light-receiving chip mounted in the light-receiving region of the substrate;
   an electronic component mounted in the substrate;
   a cover mounted on the substrate, the cover comprising a light-receiving hole disposed above and aimed at the light-receiving chip; and
   a lens fixedly mounted in the cover and positioned in the light-receiving hole,
   wherein the electronic component is an application-specific integrated circuit (ASIC), wherein the lens is selectively mounted in the cover by an adhesive bonding technique or injection molding technique.

2. The optical module integrated package as claimed in claim 1, wherein the cover comprises an accommodation chamber in communication with the light-receiving hole; the lens is disposed in an inner side of the accommodation chamber.

3. The optical module integrated package as claimed in claim 1, wherein the lens is selected from the group of planar lenses, concave lenses and convex lenses.

4. The optical module integrated package as claimed in claim 1, wherein one of the light-receiving chip and the electronic component is mounted in the substrate using surface mounting technology.

5. The optical module integrated package as claimed in claim 1, wherein one of the light-receiving chip and the electronic component is mounted in the substrate using wire bond technology.

6. The optical module integrated package as claimed in claim 1, wherein the lens is selectively made of glass or plastics.

7. The optical module integrated package as claimed in claim 1, wherein the lens comprises a filter layer coated on a surface thereof.

8. The optical module integrated package as claimed in claim 1, wherein the cover is a one piece member selectively made of metal or plastics.

* * * * *